(12) United States Patent

Pfister et al.

(10) Patent No.: US 12,658,676 B2

(45) Date of Patent: Jun. 16, 2026

(54) RED GREEN BLUE LASER MODULE

(71) Applicant: KYOCERA SLD Laser, Inc., Goleta, CA (US)

(72) Inventors: Nicholas J. Pfister, Goleta, CA (US); Oscar Romero, Tucson, AZ (US); Daming Liu, Tucson, AZ (US); James W. Raring, Santa Barbara, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 981 days.

(21) Appl. No.: 17/885,478

(22) Filed: Aug. 10, 2022

(65) Prior Publication Data

US 2024/0055835 A1 Feb. 15, 2024

(51) Int. Cl.
| | |
|---|---|
| *H01S 5/40* | (2006.01) |
| *H01S 5/02253* | (2021.01) |
| *H01S 5/024* | (2006.01) |
| *H01S 5/12* | (2021.01) |
| *H01S 5/323* | (2006.01) |

(52) U.S. Cl.
CPC ........ *H01S 5/4093* (2013.01); *H01S 5/02253* (2021.01); *H01S 5/02407* (2013.01); *H01S 5/02469* (2013.01); *H01S 5/02476* (2013.01); *H01S 5/12* (2013.01); *H01S 5/32316* (2013.01); *H01S 5/32341* (2013.01); *H01S 5/4012* (2013.01); *H01S 5/4031* (2013.01)

(58) Field of Classification Search
CPC ................................................... H01S 5/4093
See application file for complete search history.

(56) References Cited

U.S. PATENT DOCUMENTS

| | | | |
|---|---|---|---|
| 8,593,980 | B2 | 11/2013 | Bae et al. |
| 9,531,164 | B2 | 12/2016 | Raring et al. |

(Continued)

FOREIGN PATENT DOCUMENTS

| | | |
|---|---|---|
| CN | 1677779 A | 10/2005 |
| CN | 101635434 A | 1/2010 |

(Continued)

OTHER PUBLICATIONS

U.S. Appl. No. 17/962,379 , Non-Final Office Action, Mailed on May 5, 2025, 47 pages.

(Continued)

*Primary Examiner* — Minsun O Harvey
*Assistant Examiner* — Stephen Sutton Kotter
(74) *Attorney, Agent, or Firm* — Kilpatrick Townsend & Stockton LLP

(57) ABSTRACT

In an example, the present invention provides a small form factor package comprising RGB laser diode devices configured with short cavity lengths. In an example, the present laser module includes at least a first red laser diode device, at least a second green laser diode device, and at least a third red laser diode device. At least one of the laser diode devices has a cavity length of less than 200 um, or less than 150 um, or less than 100 um. The optical output beams of the red, green, and blue laser diodes are combined into a single beam or colinear beams using optical techniques. The laser diode devices and the optical combining optics contained in a sealed package device. The sealed package device has a small form factor volume.

30 Claims, 7 Drawing Sheets

Thermal Dissipation Path Of RGB Laser Module

P-side down bond RGB lasers on Hi TC heat spreader glass or ceramic substrate

Package base cross section with thermal interposer for thermal isolation

(56) References Cited

U.S. PATENT DOCUMENTS

| | | | |
|---|---|---|---|
| 9,653,642 B1 | 5/2017 | Raring | |
| 9,871,350 B2 | 1/2018 | McLaurin et al. | |
| 10,629,689 B1 | 4/2020 | Raring et al. | |
| 10,720,757 B1 | 7/2020 | Raring et al. | |
| 10,749,315 B2 | 8/2020 | McLaurin et al. | |
| 11,139,637 B2 | 10/2021 | McLaurin et al. | |
| 11,227,970 B1 | 1/2022 | Oyer et al. | |
| 11,710,944 B2 | 7/2023 | McLaurin et al. | |
| 2008/0219309 A1 | 9/2008 | Hata et al. | |
| 2011/0064102 A1 | 3/2011 | Raring et al. | |
| 2013/0039374 A1* | 2/2013 | Lutgen | H01S 5/02253 |
| | | | 372/43.01 |
| 2014/0240952 A1* | 8/2014 | Nakanishi | H01S 5/02253 |
| | | | 29/25.01 |
| 2014/0247853 A1* | 9/2014 | Deppe | H01S 5/18305 |
| | | | 372/50.11 |
| 2015/0229108 A1 | 8/2015 | Steigerwald | |
| 2016/0372893 A1 | 12/2016 | McLaurin et al. | |
| 2017/0141539 A1* | 5/2017 | Ring | H01S 5/124 |
| 2018/0269234 A1 | 9/2018 | Hughes et al. | |
| 2019/0109432 A1 | 4/2019 | Sztein et al. | |
| 2019/0273365 A1* | 9/2019 | Zediker | H01S 3/09415 |
| 2020/0099196 A1 | 3/2020 | McLaurin et al. | |
| 2021/0257814 A1* | 8/2021 | Enya | H01S 5/4093 |
| 2021/0296859 A1* | 9/2021 | Cheng | H01S 5/124 |
| 2021/0344164 A1 | 11/2021 | Steigerwald et al. | |
| 2022/0077658 A1 | 3/2022 | McLaurin et al. | |
| 2022/0189830 A1 | 6/2022 | Beyne et al. | |
| 2022/0224072 A1* | 7/2022 | Enya | H01S 5/02212 |
| 2023/0299557 A1* | 9/2023 | Hashimoto | H01S 5/0683 |
| | | | 372/44.01 |
| 2023/0352913 A1* | 11/2023 | Kasai | H01S 5/4012 |
| 2024/0079848 A1* | 3/2024 | Nakanishi | H01S 5/4093 |
| 2024/0120435 A1 | 4/2024 | Raring | |

FOREIGN PATENT DOCUMENTS

| | | |
|---|---|---|
| CN | 101689592 A | 3/2010 |
| CN | 101888059 A | 11/2010 |
| CN | 101944480 A | 1/2011 |

OTHER PUBLICATIONS

U.S. Appl. No. 15/180,737 Restriction Requirement mailed May 11, 2017, 7 pages.

U.S. Appl. No. 15/180,737 Notice of Allowance mailed Aug. 25, 2017, 11 pages.

U.S. Appl. No. 17/477,016 Non-Final Office Action mailed Nov. 29, 2022, 11 pages.

U.S. Appl. No. 15/820,160 Restriction Requirement mailed Aug. 23, 2019, 5 pages.

U.S. Appl. No. 15/820,160 Non-Final Office Action mailed Nov. 20, 2019, 8 pages.

U.S. Appl. No. 15/820,160 Notice of Allowance mailed Apr. 1, 2020, 9 pages.

U.S. Appl. No. 16/844,299 Restriction Requirement mailed Dec. 15, 2020, 6 pages.

U.S. Appl. No. 16/844,299 Non-Final Office Action mailed Mar. 3, 2021, 10 pages.

U.S. Appl. No. 16/844,299 Notice of Allowance mailed Jun. 11, 2021, 10 pages.

U.S. Appl. No. 17/477,016, Notice of Allowance, Mailed on Mar. 9, 2023, 9 pages.

U.S. Appl. No. 17/962,379 Notice of Allowance, Mailed on Oct. 9, 2025, 8 pages.

* cited by examiner

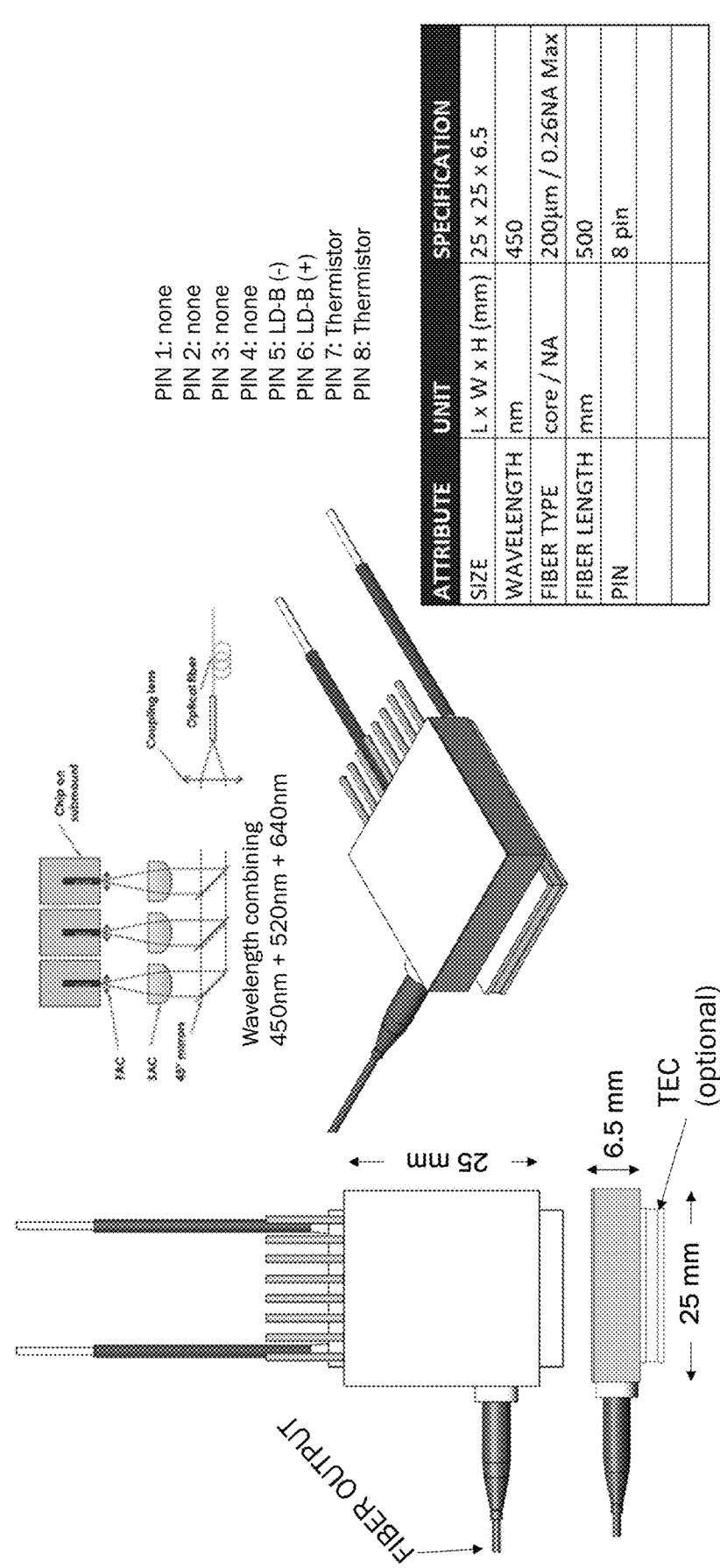
Figure 1: Fiber Coupled RGB Module

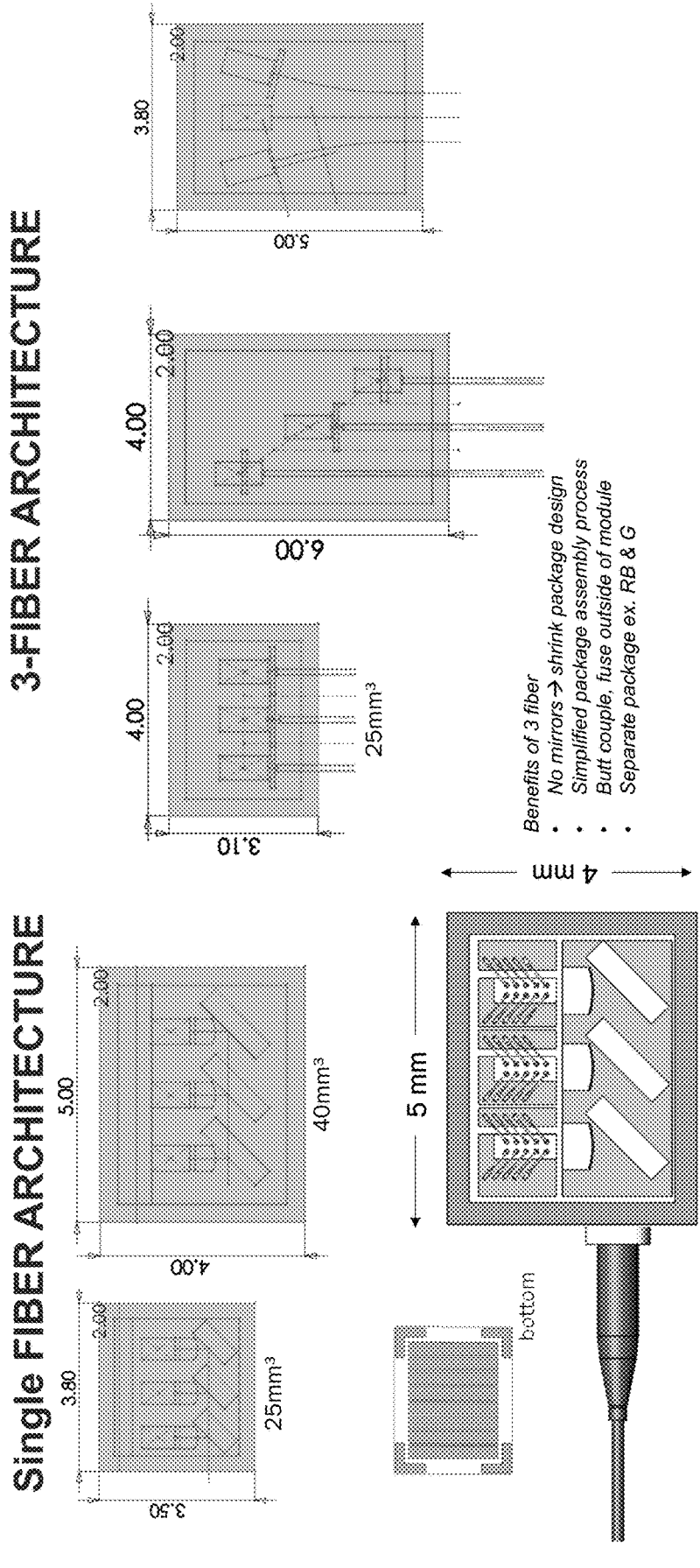
Figure 2: Single Fiber vs 3 Fiber RGB Module

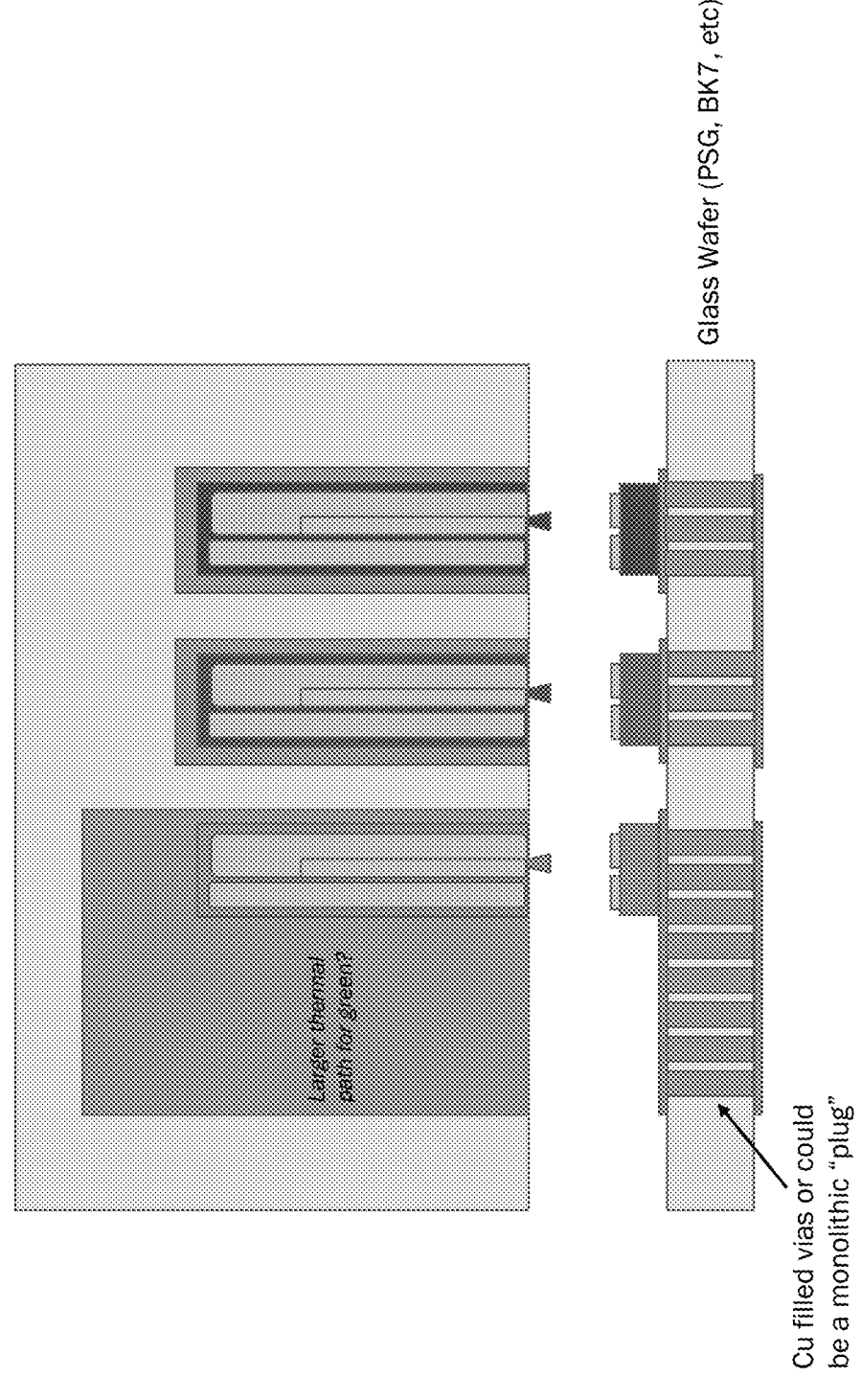
Figure 3: Thermal Interposer Substrate

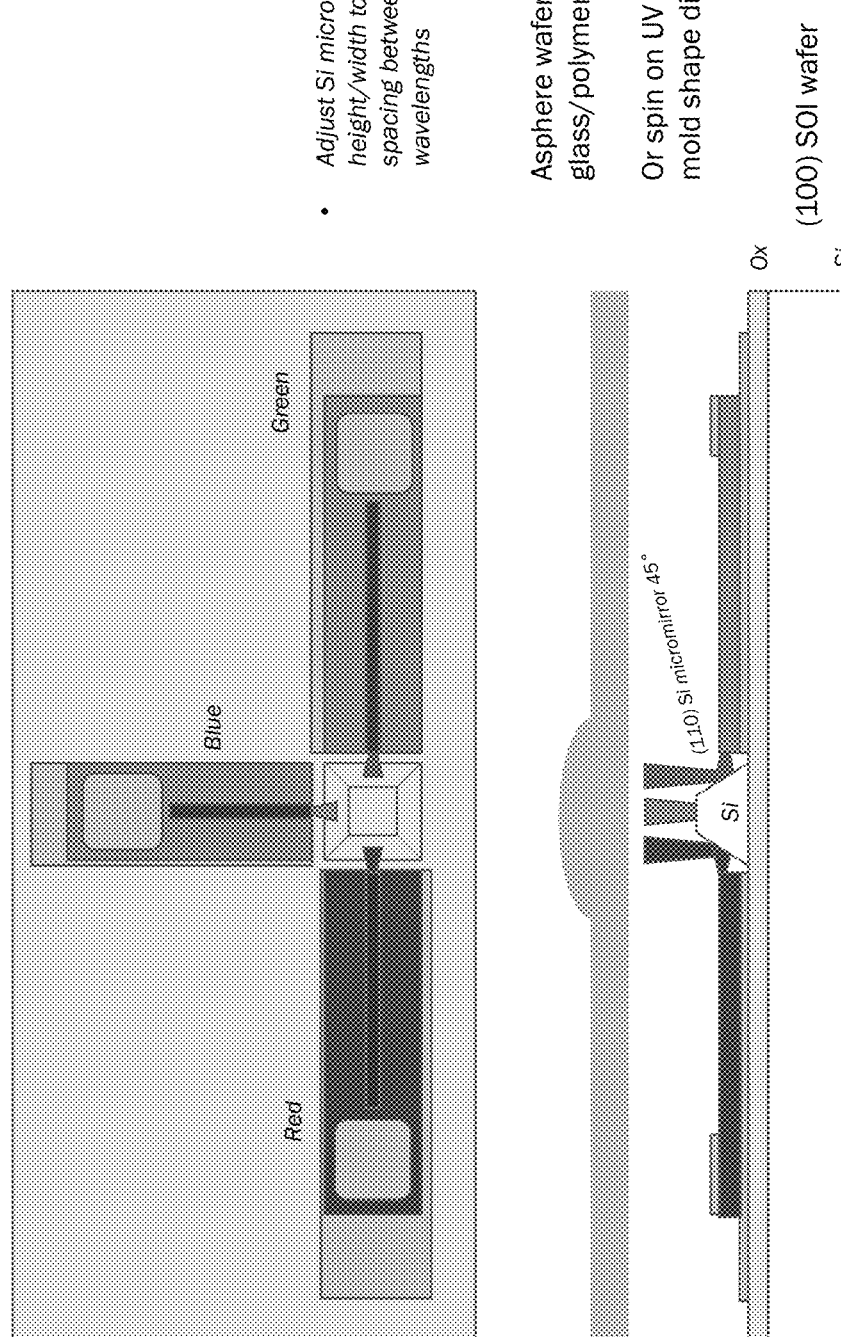
Figure 4: Out of Plane RGB Module

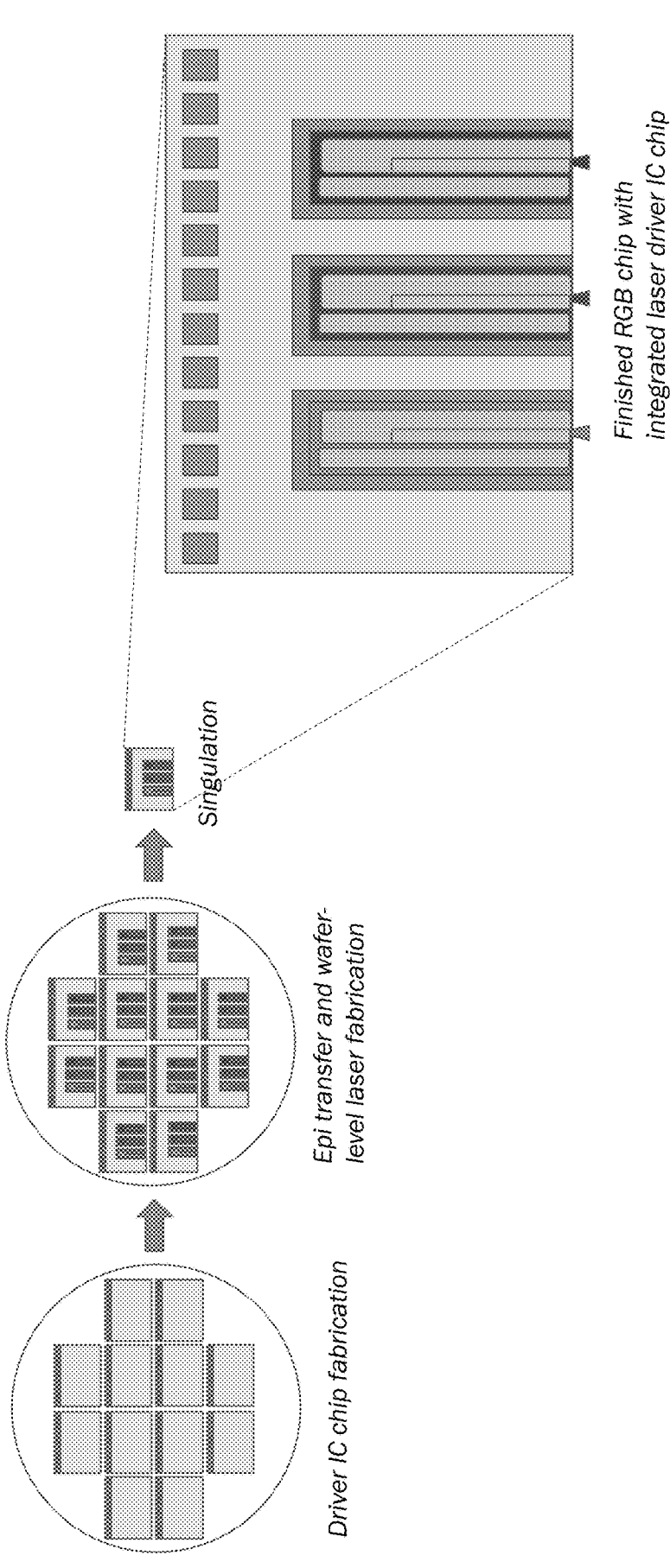
Figure 5: Integration of RGB lasers with Laser Driver IC Chip
Driver IC chip fabrication
Epi transfer and wafer-level laser fabrication
Singulation
Finished RGB chip with integrated laser driver IC chip

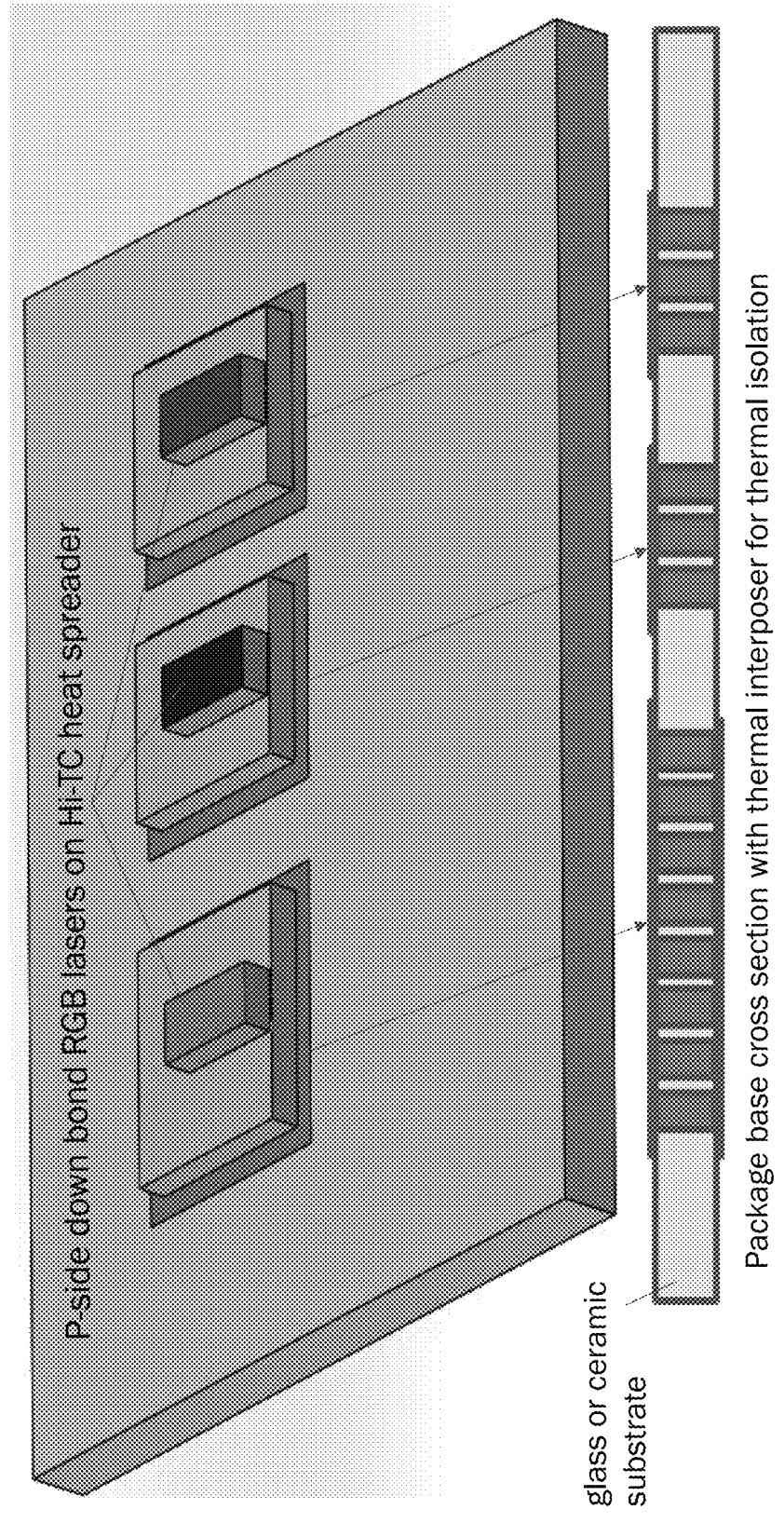
Figure 6: Thermal Dissipation Path Of RGB Laser Module

Figure 7: Thermal Dissipation Path From RGB Laser To User Heatsink
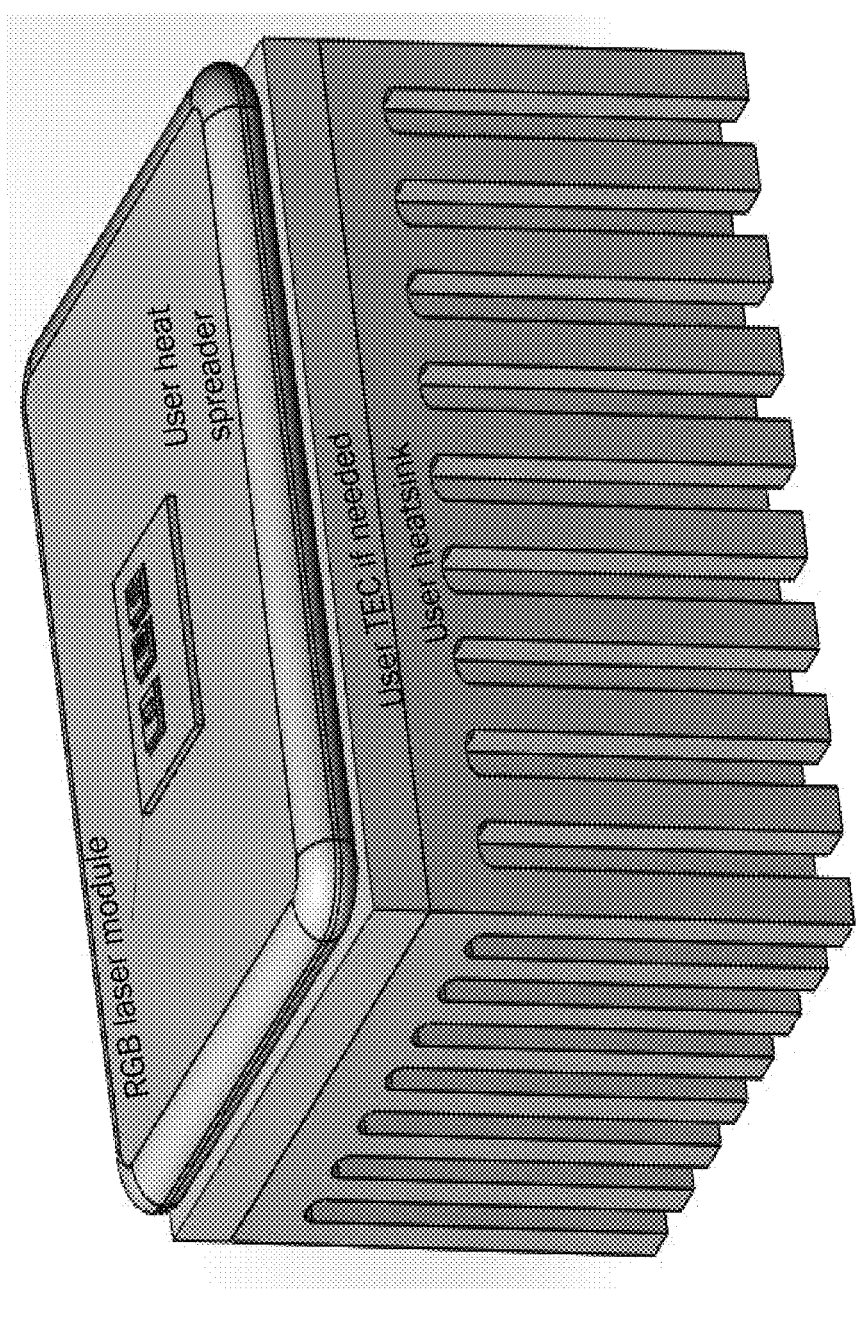

RED GREEN BLUE LASER MODULE

BACKGROUND

In 1960, the laser was demonstrated by Theodore H. Maiman at Hughes Research Laboratories in Malibu. This laser utilized a solid-state flash lamp-pumped synthetic ruby crystal to produce red laser light at 694 nm. Early visible laser technology comprised lamp pumped infrared solid-state lasers with the output wavelength converted to the visible using specialty crystals with nonlinear optical properties. For example, a green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid-state lasers with second harmonic generation" (LPSS with SHG) had wall plug efficiency of ~1% and were more efficient than Ar-ion gas lasers, but were still too inefficient, large, expensive, fragile for broad deployment outside of specialty scientific and medical applications. To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. As high-power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today.

SUMMARY

According to the present invention, techniques including methods and devices, for optical technology, are provided. In particular, the present invention provides methods, devices, and structures for optical devices, and in particular, a red, green, and blue ("RGB") laser module comprising a gallium and nitrogen containing laser device. More particularly, the present invention provides a small form factor RGB module with an interposer substrate member for thermal energy dissipation.

In an example, the present RGB module is configured with a novel substrate or base member for removing thermal energy from each of the laser diodes. In an example, the thermal energy dissipated depends on a laser efficiency and level of output power desired for a particular application. The red laser diode, the green laser diode, and the blue laser diode will often have different efficiencies. In an example, the efficiency can be as low as 5% for a green laser diode manufactured from gallium and nitride containing materials. The efficiency can also be as high as 50% or even 90% depending upon the type of laser and application. Operating power for each of the laser diode devices can also have a range of values. In an example, operating power can range from 1 mW to 300 mW for each laser device. Therefore, the thermal energy dissipated by each laser will have a large range depending on the aforementioned efficiency and operating power.

As merely an example, ultra low power applications can have about 1 mW to about 20 mW of optical output power per laser. In an example, about 2 mW to about 100 mW, or about 100 mW to about 400 mW of thermal energy will be dissipated from each laser diode device. In an example, intermediate power applications can have 20 mW to 100 mW of optical output power per laser. In an example, about 40 mW to about 200 mW, or about 200 mW to about 2 W of thermal energy will be dissipated from each laser diode device. In an example, mid power applications can have 100 mW to 400 mW of optical output power per laser diode device. In an example, about 200 mW to about 800 mW, or about 800 mW to about 8 W of thermal energy will be dissipated from each laser diode device. Of course, there can be other variations, modifications, and alternatives.

In an example, the present invention provides a small form factor package comprising RGB in-plane laser diode devices configured with short cavity lengths. In an example, the present laser module includes at least a first in-plane red laser diode device, at least a second in-plane green laser diode device, and at least a third in-plane red laser diode device. At least one of the laser diode devices has a cavity length of less than 200 um, or less than 150 um, or less than 100 um. The optical output beams of the red, green, and blue laser diodes are combined into a single beam or colinear beams using optical techniques. The laser diode devices and the optical combining optics contained in a sealed package device. The sealed package device has a total volume of less than 4 mm$^3$, or less than 2 mm$^3$, or less than 1 mm$^3$.

In an example, the present invention provides a device and related method having one or more of the following elements, including, a short cavity gallium and nitrogen containing blue and/or green in-plane laser, a nonpolar or semipolar blue or green laser diode for high modal gain, a manufacturing technique using a transferred epitaxial material process, gratings formed on n-side of either the blue or green laser diode device, blue, green, and red laser diode devices having combined output beams, a small form factor hermetically sealed package device comprising the RGB laser devices, among others. Examples of transferred epitaxial material processes are described in U.S. Pat. No. 9,871,350, issued Jan. 16, 1018, the entire contents of which are incorporated herein by reference for all purposes.

In an example, the RGB laser outputs are combined using one or more of a spatial beam combining configuration, a polarization beam combining configuration, or a spectral beam combining configuration. In an example, in spectral beam combining (SBC) multiple beams with non-overlapping optical spectra are combined using a wavelength-sensitive beam combiner. Examples of such combiners include prisms, transmission gratings, and diffraction gratings. The combiners deflect incident beams according to their wavelengths so that they all propagate in the same direction. Other approaches rely on optical components with wavelength-dependent transmission, such as dichroic mirrors or volume Bragg gratings. Of course, one of ordinary skill in the art would recognize other variations, modifications, and alternatives.

Merely by way of example, the present invention can be applied to applications such as white or infrared lighting, white or infrared spot lighting, general lighting, specialty lighting, dynamic lighting, smart lighting, flash lights, automobile headlights, automobile interior lighting, automobile position lighting and any lighting function, mobile machine lighting such as autonomous machine lighting and drone lighting, all-terrain vehicle lighting, light, sensing or communication systems, navigation systems, advanced driver assistance systems (ADAS), autonomous or semi-autonomous mobile machines and robots, sources used in recreational sports such as biking, surfing, running, racing, boating, light sources used for drones, planes, robots, other mobile or robotic applications, safety, counter measures in defense applications, multi-colored lighting, lighting for flat panels, medical applications including cancer treatment or ablation or cosmetic surgery, metrology and measurement applications, beam projectors and other display devices and systems, frequency doubling systems such as second harmonic generation (SHG) systems, SHG systems combined with nonlinear crystals like barium borate (BBO) for producing wavelengths in the 200 nm to 400 nm range, wearable displays, augmented reality systems, mixed reality systems, virtual reality systems, high intensity lamps, spectroscopy, entertainment, theater, music, and concerts, analysis fraud detection and/or authenticating, tools, purification, sterilization, anti-virus, anti-bacterial, water treatment, security systems, laser dazzlers, targeting, communications, LiFi, visible light communications (VLC), sensing, detecting, distance detecting, Light Detection And Ranging (LIDAR), smart infrastructure such as smart factories or smart homes, transformations, transportations, leveling, curing and other chemical treatments, heating, cutting and/or ablating, welding, marking, laser direct imaging, pumping other optical devices, other optoelectronic devices and related applications, storage systems, quantum computing, quantum cryptography, quantum storage, and source lighting and the like.

BRIEF DESCRIPTION OF THE FIGURES

The following drawings are merely examples for illustrative purposes according to various disclosed embodiments and are not intended to limit the scope of the present invention.

FIG. 1 is a simplified diagram of a fiber coupled module according to an example of the present invention.

FIG. 2 are simplified diagrams of a single fiber or three fiber RGB modules according to examples of the present invention.

FIG. 3 is a simplified diagram illustrating a thermal interposer device configured in a base member according to an example of the present invention.

FIG. 4 is a simplified diagram of an out of plane RGB module according to an example of the present invention.

FIG. 5 is a simplified diagram of an integrated driver and RGB devices according to an example of the present invention.

FIG. 6 is a simplified diagram illustrating a thermal path for RGB devices according to an example of the present invention.

FIG. 7 is a simplified diagram illustrating a heat sink coupled to an RGB laser module according to an example of the present invention.

DETAILED DESCRIPTION

The present invention provides techniques including methods and devices, for optical technology. In particular, the present invention provides methods, devices, and structures for optical devices, and in particular, a red, green, and blue ("RGB") laser module comprising a gallium and nitrogen containing laser device.

FIG. 1 is a simplified diagram of a fiber coupled module according to an example of the present invention. As shown, the diagram illustrates an RGB laser module configured as a light source for a display application. The display application can include augmented reality, virtual reality, mixed reality, heads up display, and others, commonly called AR, VR, MR, HUD, respectively. The module contains individually addressable lasers emitting wavelengths at 620 nm-670 nm, 510 nm-550 nm, and 430 nm-480 nm, but can be others. An output of each laser is combined and collimated within the module. Collimation of each laser uses optical elements such as lenses for fast axis and slow axis collimation. Wavelength combining uses dichroic mirrors positioned after the collimation optics. The combined and collimated light of the lasers can be coupled into an optical fiber. In addition, it can also be transmitted outside of the module in free space optical designs.

In an example, the present module can be used within near eye displays for VR that are integrating holographic optical elements. Holographic lenses are more dispersive than typical refractive lenses. This dispersion can negatively affect the resolution of display. To minimize the dispersion and improve display resolution, narrow spectral width lasers (such as, for example, 0.1 nm to 1.0 nm) are provided.

In an example, one or more volume Bragg diffraction (VBG) lasers can be integrated into the module for enabling narrow linewidth and wavelength stabilization. In an example, short cavity lasers can be used for reduced spectral width. In an example, a red laser device, a green laser device, and a blue laser device may have cavity lengths of between about 25 µm to 75 µm, of between about 75 µm to 200 µm, of between about 200 µm to 450 µm, of between about 450 µm to 700 µm, of between about 700 µm to 1200 µm, or of between about 1200 µm to 3000 µm. In another example, the lasers enable narrow linewidths and wavelength stabilization. These include distributed feedback lasers (DFB) and distributed Bragg reflector (DBF) lasers, examples of which are described in U.S. application Ser. No. 17/849,848, filed Jun. 27, 2022, the entire contents of which are incorporated herein by reference for all purposes. In another example, multiple combinations of different laser architectures can be integrated into the RGB laser module depending on performance requirements. In an example, the lasers are highly coherent and have eliminated unwanted speckle in a display application.

FIG. 2 are simplified diagrams of a single fiber or three fiber RGB modules according to examples of the present invention. As shown, the diagrams illustrate a single fiber example that combines three outputs of three different laser beams. Also shown is a three fiber RGB module. The three outputs are combined using dichroic mirrors into a single beam, and traverse through an optical feedthrough a package, and out a fiber optical cable, as shown. The backside of the package includes thermal conductive material.

In an example, the present invention provides a multi-fiber coupled RGB laser module for display applications, e.g., AR, VR, MR, HUD. Fiber coupling multiple lasers within a RGB laser module includes multiple dichroic mirrors for wavelength combining. The combined wavelengths are then focused into a single fiber with selected optics. In certain fiber-coupled examples, the present invention can combine the laser output outside of the RGB module. In an example, each laser device is coupled directly into a fiber inside the RGB module.

In an example, the optical fibers can be spliced, butt coupled, or configured outside of RGB module for wavelength combining. In an example, certain advantages can be achieved. The RGB module size can be made smaller due to reduced optical elements inside the package. In an example, the present optical configuration improves manufacturability due to eliminating complex and precise mirror alignment and attach processes. In addition, the configuration can also enable configurations which can physically separate the lasers. For example, green laser diode devices may be less efficient than blue laser diode devices. During operation, substantial parasitic heat loads may be generated and can potentially cause thermal cross talk issues if the different RGB lasers are packaged in a single module. By spatially separating the green laser with its own package and thermal management approach, cross talk can be reduced or even eliminated.

FIG. 3 is a simplified diagram illustrating a thermal interposer device configured in a base member or substrate according to an example of the present invention. In an example, the diagram illustrates a base member, which can be a glass or ceramic, or other insulating material, alone or in combination with others. The base member has isolated thermal conductive members as interposers for forming a thermal interposer base member. The thermal interposer base member is configured to reduce or prevent thermal cross talk between two or more laser diode device in an RGB laser module. Depending on output power and efficiency, the laser diode devices can generate a substantial amount of heat. The heat can have detrimental effects on laser performance and can impact adjacent lasers due to thermal cross talk, among other undesirable influences. In addition, certain applications require high control of spectrum stability (for each wavelength and the difference between wavelengths), so it is advantageous to implement designs to thermally isolate each of the laser diode devices.

In an example, thermally isolating materials such as glass or low thermal conductivity ceramic can be used as a thermal interpose base member. The thermal interposer base member has high thermal conductivity metal, e.g., copper pads, for attaching lasers on the top surface. The pads are connected with thermally conductive vias or plugs that traverse through a thickness of the base member from a front side of the substrate to the backside of the base member to remove heat and thermal energy vertically (as shown) through the base member while minimize heat transport laterally to adjacent lasers. The size and density of the thermal vias or size of the thermal plugs can be tuned for a given heat load for each laser diode device. In this example, a larger pad is provided for the green laser due to a higher heat load because of reduced efficiency. The pads on the backside of the thermal interposer base member can either be connected to a single thermal heat sink or can be isolated to individual thermal heat sinks.

In the example, the interposer base member can be fabricated out of a glass such as Schott BK7 (or other glass base members with tuned coefficient of thermal expansion, commonly called CTE) to provide better CTE matching to the CTE of the Group laser diode devices or copper vias and/or plugs or others. Through glass vias or plug fabrication can be performed using various techniques such as, for example, laser ablation, mechanical drilling, wet etching, dry etching or laser damage and etch processes. After the vias or plugs are fabricated onto the base member, the vias are filled with copper material or other conductive thermally material using typical via plating processes and can be connected with copper pads that can be fabricated with typical copper redistribution layer processes.

In another example, the interposer base member can be fabricated out of a photosensitive glass (PSG) such as FOTURAN™ manufactured by SCHOTT A.G. of Germany. PSG can enable highly vertical vias (or plugs) from manufactured by anisotropic etching of the crystallized regions (after exposure and heat treatment). In addition to the vias, the PSG can also be processed to create air gap isolation between any pair of laser devices for further isolation.

In another example, the interpose base member can be fabricated using multilayer ceramic component (MLCC) manufacturing processes. Metal pads and traces can be integrated into the base member with a wide variety of insulating and conducting materials based on thermal heat load and CTE requirements.

FIG. 4 is a simplified diagram of an out of plane RGB module according to an example of the present invention. In an example, the diagram illustrates an out of plane RGB laser module chip. An out of plane RGB module design can improve manufacturability by leveraging wafer level process approaches which minimizes die level processing. It incorporates multiple laser diodes positioned on silicon substrate with a (100) orientation to facility mirror fabrication. The mirrors can be fabricated on a (100) silicon wafer using etch masks with an anisotropic etch chemistry such as KOH. The KOH etch chemistry can create 45 deg mirrors on the (110) planes. For further control of the mirror geometry, one can use a silicon on insulator (SOI) wafer which has a precisely controlled thickness of silicon bonded to a silicon wafer using an oxide layer for bonding. During the KOH etching, the oxide acts as an etch stop layer to control the height of the mirror. The lateral dimensions can be controlled independently by etch chemistry and time. The remaining oxide also acts as an electrical insulating layer between laser diodes. After the mirrors are fabricated bonding pads and interconnects are formed. The laser diodes are arranged on the micro mirror wafer so that the reflective beam paths of the lasers are normal to the surface of the chip. By controlling the: geometry of the mirror, height of the emitter, and distance between the emitters and the mirror, the distance of the reflective beam paths can be minimized and can mitigate the need for additional beam combining optics. For collimation, an aspheric optic can be attached in close proximity with the laser diode devices.

In an example, discrete aspheric optics can be attached to the RGB micro-mirror wafer using high accuracy die attach systems using UV cure adhesives or other attach methodologies. In another example, multiple lenses can be fabricated in parallel at the wafer level using molded glass or polymer processes. A separate molded optic wafer can be aligned and attached to the RGB micro-mirror wafer. This finished wafer level optic assembly can then go through high volume wafer level testing systems before singulation into discrete chips.

FIG. 5 is a simplified diagram of an integrated driver and RGB devices according to an example of the present invention. As shown, the diagram illustrates RGB laser diode devices with and an integrated laser driver integrated circuit chip. In an example, the integrated laser driver and RGB laser devices can be made using a wafer level laser fabrication process to directly attach and fabricate lasers onto a laser driver integrated circuit chip. The integrated driver and laser are ultracompact and is designed for high volume production manufacturing. In an example, the laser driver integrated circuit is fabricated on a silicon wafer using CMOS fabrication processes. The final metal routing and over glass layers of the driver IC can be designed to facilitate further wafer level laser fabrication processes.

To fabricate the laser devices, epitaxial materials with different wavelengths are grown on alternate substrates. In the case red laser diode material is grown on GaAs substrates, and blue and green laser materials are grown on GaN substrates. After growth, p-contacts and bonding pad metals are deposited and patterned. The epi-layers are undercut from the original substrate using various release processes and then transferred and die-expanded to the silicon driver integrated circuit substrate using, for example, gold-gold thermocompression bonding.

After bonding the red, green, and blue epi-layers to the silicon wafer, ridges are formed in the transferred material via dry etching. After ridge formation, passivation layers are deposited and patterned. Facets are formed at the wafer level using dry etch processes and coated with a wafer level passivation and HR coating process. At this point vias are formed in the passivation layer and n-contacts are deposited and patterned. After fabrication, the completed RGB lasers with IC driver chips are singulated and ready for final test and packaging.

FIG. 6 is a simplified diagram illustrating a thermal path for RGB devices according to an example of the present invention. As shown, the diagram illustrates RGB devices onto a thermal spreader, and then thermal conductive members, which also isolate pairs of RGB laser diode devices. In an example, due to a narrow laser stripe width and short cavity length as well as a quite amount of the waste heat generated in laser junction area, a high thermal conducting heat spreader with the thermal conductivity (TC) much higher than copper is used to dissipate heat from each laser diode device. In an example, the heat spreader material can be diamond, graphite, CVD (chemical vapor deposition)-diamond, silver-diamond and other high thermal conducting materials.

In an example, the laser devices using p-side down bonding is needed to efficiently spread heat from laser junction area directly to high thermal conductivity spreader before reaching a package base region. Because of the p-side down die attach, the heat spreader CTE matching with the laser chip is configured. In an example, the package base can be designed with the thermal interposer concept shown above to thermally isolate the three laser diode chips from each other.

FIG. 7 is a simplified diagram illustrating a heat conductor coupled to an RGB laser module according to an example of the present invention. In an example, considering the amount of the heat generated from RGB laser module and compact size of the laser module, the present device includes a heat spreader between the RGB laser module and a heatsink. The heat spreader can be made of a solid copper plate or a mini-vapor chamber to well spread the heat laterally for efficiently utilizing the heatsink. In an example, the heatsink can be configured to dissipate the heat to environmental air or another region. Further details of the present device and related methods are provided below.

In an example, the present invention provides an optical module device. The device has a first laser device comprising a gallium and arsenide material configured to emit electromagnetic output radiation in a range of 620 to 670 nm, a second laser device comprising a gallium and nitrogen material configured to emit electromagnetic output radiation in a range of 510 to 550 nm, and a third laser device comprising a gallium and nitrogen material configured to emit electromagnetic output radiation in a range of 430 to 480 nm. The device has a first lens device coupled to an output of the first laser device, a second lens device coupled to an output of the second laser device, and a third lens device coupled to an output of the third laser device. The device has an optical combining device coupled to the first lens device, the second lens device, and the third lens device to combine an output of the first laser device, an output of the second laser device, and an output of the third laser device and emit collimated light. The device has a package device enclosing the first laser device, the second laser device, the third laser device, and the optical combining device to form an enclosed space and configured to seal the enclosed space. The package device includes at least a base member and a lid member, the base member configured to remove thermal energy from the first laser device, the second laser device, and the third laser device.

In an example, the second laser device and/or the third laser device have a crystalline surface region with either a nonpolar or semipolar orientation. Examples are described in U.S. Pat. No. 10,862,274, issued Dec. 8, 2020, the entire contents of which are incorporated herein by reference for all purposes.

In an example, at least one of the first laser device, the second laser device, or the third laser device include etched facets, or each of the first laser device, the second laser device, and the third laser device include etched facets. Examples are described in U.S. Pat. No. 11,139,634, issued Oct. 5, 2021, the entire contents of which are incorporated herein by reference for all purposes.

In an example, the base member comprises a thermally insulating material such as a glass or ceramic material, and the base member includes a plurality of thermal interposer structures configured with high thermal conductivity. A first thermal interposer structure underlying the first laser device, a second thermal interposer structure underlying the second laser device, and a third thermal interposer structure underlying the third laser device.

In an example, the first, second, and third thermal interposer structures are comprised of a metal such as copper or copper tungsten, diamond, silicon carbide, graphene, aluminum nitride, silicon, a heat pipe structure, a vapor chamber, or other type of thermal member.

In an example, the first, second, and third thermal interposer structures are adjoined to form a single thermally conductive thermal interposer structure.

In an example, the optical module device includes a first thermally conductive heat spreader, a second thermally conductive heat spreader, and a third thermally conductive heat spreader. The first thermally conductive heat spreader is configured between the first laser device and the first thermal interposer structure, the second thermally conductive heat spreader is configured between the second laser device and the second thermal interposer structure, and the third thermally conductive heat spreader is configured between the third laser device and the third thermal interposer structure. The first, second, and third thermally conductive heat spreaders may be comprised of a metal such as copper or copper tungsten, diamond, CVD-diamond, Ag-diamond composite, silicon carbide, aluminum nitride, graphene, silicon.

In an example, the optical module device has one or more heat sink members that are thermally coupled to the first, second, and third thermally conductive thermal interposer structures in the base member. The one or more heat sink members are configured to maintain a first junction temperature of 150 Degrees C. and less for one or more of the first laser device, the second laser device, or the third laser device. In an example, the base member comprises a thermally insulating material such as a glass or ceramic material, and thermal interposer structures coupled to one or more of the first laser device, the second laser device, or the third laser device to maintain a first junction temperature of 150 Degrees C. and less for one or more of the first laser device, the second laser device, or the third laser device. The thermal interposer structures may comprise a thermal spreader, a heat pipe, a vapor cavity, or thermal member.

In an example, the optical module device includes one or more active cooling devices such as a thermoelectric cooler. The one or more active cooling devices are coupled to the first, second, and third thermal interposer structures in the base member. The one or more active cooling devices are configured to maintain a first junction temperature of 130 Degrees C. and less for one or more of the first laser device, the second laser device, or the third laser device.

In an example, the optical module device includes one or more active cooling devices such as a thermoelectric cooler. The one or more active cooling devices are configured for independently controlling the junction temperature of the first laser device, the second laser device, or the third laser device.

In an example, each of the first laser device, the second laser device, and third laser device is an in-plane or edge emitting configuration. In an example, each of the first laser device, the second laser device, and the third laser device is in an out of plane emitting configuration, which is characterized by a surface emitting laser device, e.g., VCSEL.

In an example, the optical module has a fiber optical cable coupled to the optical combining device to transfer the emitted collimated light. In an example, the optical module is coupled to a free space coupled to the optical combining device to transfer the emitted collimated light.

In an example, the optical combining device is configured as a spatial beam combiner. In an example, the optical combining device is configured as a polarization beam combiner. In an example, the optical combining device is configured as a spectral beam combiner. In an example, the optical combining device is configured using two or more of a spatial beam combiner, a polarization beam combiner, or a spectral beam combiner.

In an example, the module can have a first dichroic mirror coupled to the first lens device, a second dichroic mirror coupled to the second lens device, and a third dichroic mirror coupled to the third lens device. The optical combining device includes the first dichroic mirror, the second dichroic mirror, and the third dichroic mirror configured to combine the output of the first laser device, the output of the second laser device, and the output of the third laser device and emit collimated light. The module has a fiber optic cable coupled to optical combining device to receive and propagate the collimated light emitted from the optical combining device.

In a preferred example, each of the first laser device, the second laser device, and the third laser device is configured with a spectral width ranging from 0.01 nm to 1.0 nm. In an example, the third laser device (blue or green laser) comprises a cavity length of 200 micrometers and less, 150 micrometers and less, and 100 micrometers and less. In an example, at least one of the first laser device, the second laser device, or the third laser device is optical grating structures. In an example, at least one of the first laser device, the second laser device, or the third laser device is configured is configured as a DFB laser diode.

In an example, the package device is configured with a volume of less than 50 mm$^3$ or less than 25 mm$^3$ as measured by an outer surface of the lid member and the base member of the package device.

In an example, the module has a base member configured with a backside surface and a front side surface, which is coupled to the first laser device, the second laser device, and the third laser device. In an example, an energy output of a laser output of each of the first laser device, the second laser device, and the third laser device is within 70% for an operation of at least 1000 hours and the backside surface is characterized by a temperature of 60 Degrees Celsius and less.

In an example, a peripheral integrated circuit chip (e.g., driver) coupled to each of the first laser device, the second laser device, and the third laser device. The driver can be provided on a surface mount of the laser diode devices or the laser chips can be attached to a common base member of the peripheral integrated circuit chip.

In an example, the present invention provides a small packaged RGB module device. The device has a base member comprising a glass or a ceramic material, and has a front surface region and a back surface region. The device has a first heat conducting member configured within a first portion of the substrate member, a second heat conducting member configured within a second portion of the substrate member, and a third heat conducting member configured within a third portion of the substrate member. In an example, the device has a first laser device comprising a gallium and arsenide material configured to emit electromagnetic output radiation in a range of 620 to 670 nm. The first laser device is in thermal contact with the first heat conducting member. The device has a second laser device comprising a gallium and nitrogen material configured to emit electromagnetic output radiation in a range of 510 to 550 nm. The second laser device is in thermal contact with the second heat conducting member. The device has a third laser device comprising a gallium and nitrogen material configured to emit electromagnetic output radiation in a range of 430 to 480 nm. The third laser device is in thermal contact with the third heat conducting member. The device has a first lens device coupled to an output of the first laser device, a second lens device coupled to an output of the second laser device, and a third lens device coupled to an output of the third laser device. The device has an optical combining device coupled to the first lens device, the second lens device, and the third lens device to combine an output of the first laser device, an output of the second laser device, and an output of the third laser device and emit collimated light. The device has a package device enclosing the first laser device, the second laser device, the third laser device. The package device forms an enclosed space and is configured to seal the enclosed space and hermetically seal the first laser device, the second laser device, and the third laser device. In an example, the package device has a volume of 4 mm3 to 40 mm3 as measured from an outer surface region of the base member and a lid region. Edge regions enclose the back surface region and lid region. In an example, an optical feedthrough device is coupling the emitted collimated light to a spatial region outside of the package device. The device also has an electrical feedthrough device configured to coupled electrical power to the first laser device, the second laser device, and the third laser device. In an example, the first thermally conducting member, the second thermally conducting member, and the third thermally conducting member are each thermally isolated from each other and configured to isolate and reduce thermal cross-talk between any pair of the first laser device, the second laser device, and the third laser device. In an example, the first lens device, the second lens device, and the third lens device are configured as a single optical element.

While the above is a full description of the specific embodiments, various modifications, alternative constructions and equivalents may be used. As an example, the packaged device can include any combination of elements described above, as well as outside of the present specification. Although the embodiments above have been described in terms of a laser diode, the methods and device structures can also be applied to other stimulated light emitting devices. Therefore, the above description and illustrations should not be taken as limiting the scope of the present invention which is defined by the appended claims.

What is claimed is:

1. An optical device comprising:
a first laser device comprising a gallium and arsenide material configured to emit electromagnetic output radiation in a range of 620 to 670 nm;
a second laser device comprising a gallium and nitrogen material configured to emit electromagnetic output radiation in a range of 510 to 550 nm;
a third laser device comprising a gallium and nitrogen material configured to emit electromagnetic output radiation in a range of 430 to 480 nm;
a first lens device coupled to an output of the first laser device;
a second lens device coupled to an output of the second laser device;
a third lens device coupled to an output of the third laser device;
an optical combining device coupled to the first lens device, the second lens device, and the third lens device to combine an output of the first laser device, an output of the second laser device, and an output of the third laser device and emit collimated light; and
a package device enclosing the first laser device, the second laser device, the third laser device, and the optical combining device to form an enclosed space and configured to seal the enclosed space, the package device comprised of at least a base member and a lid member, the base member configured to remove thermal energy from the first laser device, the second laser device, and the third laser device, the base member comprising a thermally insulating material, a plurality of thermally conductive pads, and a plurality of thermally conductive interposer plugs, the plurality of thermally conductive pads including frontside pads arranged on a front surface of the thermally insulating material and backside pads arranged on an opposite back surface of the thermally insulating material, wherein the frontside pads are spaced from each other and separate ones of the frontside pads underly each of the first laser device, the second laser device, and the third laser device, and the frontside pads are thermally connected to the backside pads by the plurality of the thermally conductive interposer plugs, each of the plurality of the thermally conductive interposer plugs extending through the thermally insulating material and connecting one of the frontside pads to one of the backside pads.

2. The device of claim 1 wherein the backside pads include a first backside pad and a second backside pad, wherein the first backside pad is thermally isolated from the second laser device and thermally connected to the first laser device and the third laser device, and the second backside pad is thermally isolated from the first laser device and the third laser device and thermally connected to the second laser device.

3. The device of claim 1 wherein the first, second, and third thermal interposer structures are comprised of at least one of copper, copper tungsten, diamond, silicon carbide, graphene, aluminum nitride, silicon, a heat pipe structure, a vapor chamber, or another type of thermally conductive member.

4. The device of claim 1 wherein the first, second, and third thermal interposer structures are adjoined to form a single thermally conductive thermal interposer structure.

5. The device of claim 1 further comprising a first thermally conductive heat spreader, a second thermally conductive heat spreader, and a third thermally conductive heat spreader; wherein the first thermally conductive heat spreader is configured between the first laser device and the first thermal interposer structure, the second thermally conductive heat spreader is configured between the second laser device and the second thermal interposer structure, and the third thermally conductive heat spreader is configured between the third laser device and the third thermal interposer structure.

6. The device of claim 5 wherein the first, second, and third thermally conductive heat spreaders are comprised at least one of copper, copper tungsten, diamond, CVD-diamond, Ag-diamond composite, silicon carbide, aluminum nitride, graphene, or silicon.

7. The device of claim 1 further comprising one or more heat sink members; the one or more heat sink members are thermally coupled to the first, second, and third thermal interposer structures in the base member; the one or more heat sink members configured to maintain a first junction temperature of 150 Degrees C. and less for one or more of the first laser device, the second laser device, or the third laser device.

8. The device of claim 1 further comprising one or more active cooling devices; the one or more active cooling devices coupled to the first, second, and third thermal interposer structures in the base member; the one or more active cooling devices configured to maintain a first junction temperature of 130 Degrees C. and less for one or more of the first laser device, the second laser device, or the third laser device.

9. The device of claim 1 further comprising one or more active cooling devices; the one or more active cooling devices configured for independently controlling the junction temperature of the first laser device, the second laser device, or the third laser device.

10. The device of claim 1 wherein each of the first laser device, the second laser device, and third laser device is an in-plane or edge emitting configuration.

11. The device of claim 1 wherein at least one of the first laser device, the second laser device, and the third laser device is an out of plane emitting characterized by a surface emitting laser device.

12. The device of claim 1 further comprising a fiber optical cable coupled to the optical combining device to transfer the emitted collimated light.

13. The device of claim 1 further comprising a free space coupled to the optical combining device to transfer the emitted collimated light.

14. The device of claim 1 wherein the optical combining device is configured as a spatial beam combiner.

15. The device of claim 1 wherein the optical combining device is configured as a polarization beam combiner.

16. The device of claim 1 wherein the optical combining device is configured as a spectral beam combiner.

17. The device of claim 1 wherein the optical combining device is configured using two or more of a spatial beam combiner, a polarization beam combiner, or a spectral beam combiner.

18. The device of claim 1 further comprising:
a first dichroic mirror coupled to the first lens device;
a second dichroic mirror coupled to the second lens device;

a third dichroic mirror coupled to the third lens device;

whereupon the optical combining device comprising the first dichroic mirror, the second dichroic mirror, and the third dichroic mirror configured to combine the output of the first laser device, the output of the second laser device, and the output of the third laser device and emit collimated light;

a fiber optic cable coupled to the optical combining device to receive and propagate the collimated light emitted from the optical combining device.

19. The device of claim 1 wherein each of the first laser device, the second laser device, and the third laser device is configured with a spectral width ranging from 0.01 nm to 1.0 nm.

20. The device of claim 1 wherein the third laser device comprises a cavity length of 100 micrometers and less.

21. The device of claim 1 wherein at least one of the first laser device, the second laser device, or the third laser device is configured with optical grating structures.

22. The device of claim 21 wherein the laser at least one of the first laser device, the second laser device, or the third laser device is configured as a DFB laser diode.

23. The device of claim 1 wherein the second laser device and/or the third laser device have a crystalline surface region with either a nonpolar or semipolar orientation.

24. The device of claim 1 wherein at least one of the first laser device, the second laser device, or the third laser device include etched facets, or each of the first laser device, the second laser device, and the third laser device include etched facets.

25. The device of claim 1 wherein the package device is configured with a volume of less than 25 mm$^3$ as measured by an outer surface of the lid member and base member of the package device.

26. The device of claim 1 wherein the base member is configured with a backside surface and a front side surface, the front side surface coupled to the first laser device, the second laser device, and the third laser device, and wherein an energy output of a laser output of each of the first laser device, the second laser device, and the third laser device is within 70% for an operation of at least 1000 hours and the backside surface is characterized by a temperature of 60 Degrees Celsius and less.

27. The device of claim 1 further comprising a peripheral integrated circuit chip coupled to each of the first laser device, the second laser device, and the third laser device.

28. The device of claim 1 wherein the gallium and nitrogen material of at least one of the second laser device or the third laser device is formed using a transferred epitaxial material process.

29. A small packaged RGB module device, the device comprising:

a base member comprising a thermally insulating material, the base member having a front surface region and a back surface region;

a first heat conducting member configured within a first portion of the base member, the first heat conducting member including a first frontside thermally conductive pad on the front surface region of the base member and a first backside thermally conductive pad on the back surface region of the base member, wherein the first frontside thermally conductive pad is connected to the first backside thermally conductive pad by a first plurality of thermally conductive interposer plugs that extend through the base member;

a second heat conducting member configured within a second portion of the base member, the second heat conducting member including a second frontside thermally conductive pad on the front surface region of the base member and a second backside thermally conductive pad on the back surface region of the base member, wherein the second frontside thermally conductive pad is connected to the second backside thermally conductive pad by a second plurality of thermally conductive interposer plugs that extend through the base member;

a third heat conducting member configured within a third portion of the base member, the third heat conducting member including a third frontside thermally conductive pad on the front surface region of the base member and a third backside thermally conductive pad on the back surface region of the base member, wherein the third frontside thermally conductive pad is connected to the third backside thermally conductive pad by a third plurality of thermally conductive interposer plugs that extend through the base member;

a first laser device comprising a gallium and arsenide material configured to emit electromagnetic output radiation in a range of 620 to 670 nm, the first laser device in thermal contact with the first heat conducting member;

a second laser device comprising a gallium and nitrogen material configured to emit electromagnetic output radiation in a range of 510 to 550 nm, the second laser device in thermal contact with the second heat conducting member;

a third laser device comprising a gallium and nitrogen material configured to emit electromagnetic output radiation in a range of 430 to 480 nm, the third laser device in thermal contact with the third heat conducting member;

a first lens device coupled to an output of the first laser device;

a second lens device coupled to an output of the second laser device;

a third lens device coupled to an output of the third laser device;

an optical combining device coupled to the first lens device, the second lens device, and the third lens device to combine an output of the first laser device, an output of the second laser device, and an output of the third laser device and emit collimated light;

a package device enclosing the first laser device, the second laser device, the third laser device, and the optical combining device to form an enclosed space and configured to seal the enclosed space and hermetically seal the first laser device, the second laser device, and the third laser device, the package device having a volume of 4 mm$^3$ to 40 mm$^3$ as measured from an outer surface region of the base member and a lid region;

an optical feedthrough device coupling the emitted collimated light to a spatial region outside of the package device;

an electrical feedthrough device to couple electrical power to the first laser device, the second laser device, and the third laser device; and whereupon the first heat conducting member, the second heat conducting member, and the third heat conducting member are each thermally isolated from each other and configured to isolate thermal cross-talk between any pair of the first laser device, the second laser device, and the third laser device.

30. The device of claim 29 wherein the first lens device, the second lens device, and the third lens device are configured as a single optical element.

\* \* \* \* \*